United States Patent [19]
Keeth

[11] Patent Number: 6,078,540
[45] Date of Patent: *Jun. 20, 2000

[54] SELECTIVE POWER DISTRIBUTION CIRCUIT FOR AN INTEGRATED CIRCUIT

[75] Inventor: Brent Keeth, Boise, Id.

[73] Assignee: Micron Technology, Inc., Boise, Id.

[*] Notice: This patent is subject to a terminal disclaimer.

[21] Appl. No.: 09/304,299

[22] Filed: May 3, 1999

Related U.S. Application Data

[63] Continuation of application No. 08/918,637, Aug. 22, 1997, which is a continuation-in-part of application No. 08/685,783, Jul. 24, 1996, Pat. No. 5,761,146.

[51] Int. Cl.[7] .................................................. G11C 13/00
[52] U.S. Cl. ................... 365/226; 365/189.07; 365/195; 365/200; 365/201; 365/230.03
[58] Field of Search .................... 365/226, 201, 365/200, 189.07, 230.03, 225.7

[56] References Cited

U.S. PATENT DOCUMENTS

| | | | |
|---|---|---|---|
| 3,762,037 | 10/1973 | Baker et al. | 29/574 |
| 4,799,193 | 1/1989 | Horiguchi et al. | 365/149 |
| 4,992,984 | 2/1991 | Busch et al. | 365/200 |
| 5,025,344 | 6/1991 | Maly et al. | 361/88 |
| 5,134,584 | 7/1992 | Boler et al. | 365/200 |
| 5,235,548 | 8/1993 | Kurkowski | 365/200 |
| 5,235,550 | 8/1993 | Zagar | 365/226 |
| 5,255,234 | 10/1993 | Seok | 365/210 |
| 5,262,993 | 11/1993 | Horiguchi et al. | 365/200 |
| 5,295,101 | 3/1994 | Stephens, Jr. et al. | 365/200 |
| 5,349,559 | 9/1994 | Park et al. | 365/201 |
| 5,384,727 | 1/1995 | Moyal et al. | 365/96 |
| 5,396,465 | 3/1995 | Oh et al. | 365/201 |
| 5,400,281 | 3/1995 | Morigami | 365/201 |
| 5,406,520 | 4/1995 | Tay | 365/200 |
| 5,412,594 | 5/1995 | Moyal et al. | 365/96 |
| 5,412,601 | 5/1995 | Sawada et al. | 365/185 |
| 5,424,989 | 6/1995 | Hagiwara et al. | 365/201 |
| 5,428,575 | 6/1995 | Fudeyasu | 365/201 |
| 5,465,234 | 11/1995 | Hannai | 365/200 |
| 5,615,162 | 3/1997 | Houston | 365/226 |
| 5,673,232 | 9/1997 | Furutani | 365/226 |
| 5,761,145 | 6/1998 | Zagar et al. | 365/226 |
| 5,787,044 | 7/1998 | Duesman | 365/200 |
| 5,901,105 | 6/1999 | Ong et al. | 365/230.08 |
| 5,946,257 | 8/1999 | Keeth | 365/226 |

FOREIGN PATENT DOCUMENTS

| | | | |
|---|---|---|---|
| 0283186 | 9/1988 | European Pat. Off. | G06F 11/20 |
| 0451595 | 10/1991 | European Pat. Off. | |

OTHER PUBLICATIONS

Kitsukawa, G., et al., "WP 3.4: 256Mb DRAM Technologies for File Applications", *1993 IEEE International Solid–State Circuits Conf.*, 48, 49, 261, (1993).

Primary Examiner—David Nelms
Assistant Examiner—David Lam
Attorney, Agent, or Firm—Schwegman, Lundberg, Woessner & Kluth, P.A.

[57] ABSTRACT

A memory circuit is described which includes distributed voltage generators to selectively provide power to memory arrays of the memory circuit. Each memory array can be turned off by deactivating its voltage generator if it is determined that the memory array is defective and cannot be repaired. The memory device, therefore, can be salvaged by reducing the operational capacity of the memory device. The distributed voltage generators can be selectively deactivated to test the memory circuit.

18 Claims, 9 Drawing Sheets

SELECTIVE POWER DISTRIBUTION CIRCUIT FOR AN INTEGRATED CIRCUIT

This application is a continuation of U.S. Ser. No. 08/918,637 filed Aug. 22, 1997, which is a continuation-in-part of U.S. Ser. No. 08/685,783 filed Jul. 24, 1996 which issued as U.S. Pat. No. 5,761,146 on Jun. 2, 1998.

TECHNICAL FIELD OF THE INVENTION

The present invention relates generally to integrated circuits and in particular the present invention relates to a power distribution system for an integrated circuit.

BACKGROUND OF THE INVENTION

As the device geometries of integrated circuits continue to decrease with improvements in manufacturing processes, greater numbers of circuits can be fabricated on a single integrated circuit die. There is also an increased probability that at least some of these circuits will be defective in some way. It has become standard practice in the design of Dynamic Random Access Memory (DRAM) devices to provide redundant memory elements that can be used to replace defective memory elements and thereby increase device yields. Redundant elements can only be used to repair certain types of defects by replacing a row, column or an array of devices. Depending on the particular defect repaired, the device may exhibit undesirable characteristics such as increased standby current, speed degradation, reduction in operating temperature range, or reduction in supply voltage range as a result of the defect being present on the die. Certain other types of defects cannot be repaired effectively through redundancy techniques alone. Defects such as power to ground shorts in a portion of the array can prevent the device from operating even to the extent required to locate the defect in a test environment. Memory devices with limited known defects have been sold as "partials", "audio RAMs" or "off spec devices" provided that the defects do not prohibitively degrade the performance of the functional portions of the memory. The value of a partially functional device decreases dramatically as the performance of the device deviates from that of the standard fully functional device. The desire to make use of devices with limited defects, and the problems associated with the performance of these devices due to the defects are well known in the industry.

For the reasons stated above, and for other reasons stated below which will become apparent to those skilled in the art upon reading and understanding the present specification, there is a need in the art for an integrated circuit which can be modified after fabrication using a selective power distribution system to isolate portions of the integrated circuit and maximize production yield.

The above mentioned problems with integrated circuits and other problems are addressed by the present invention and will be understood by reading and studying the following specification.

The present invention describes an integrated circuit that includes multiple block elements, at least one isolation circuit to influence the multiple block elements to reduce operational capacity of a defective block element, a bus, and a control circuit to provide control and data signals to and from the block elements via the bus. The present invention also describes the multiple block elements as diverse in functionality with respect to other block elements. The present invention additionally describes the multiple block elements as similar in functionality with respect to the other block elements. The present invention describes that the isolation circuit includes a current detector circuit to monitor and disable the defective block element when a predetermined power usage is reached. The present invention also describes a test circuit for determining the defective block element.

In a second embodiment, a memory module is described as comprising a plurality of memory devices, at least one functionally defective; a plurality of data input and output lines, connected correspondingly to each of the plurality of memory devices; and means for performing the function of terminating the data input and output lines, and isolating the at least one functionally defective device so that the desired memory module configuration is obtained.

In a third embodiment, a memory device is described to include a plurality of subarrays, at least one subarray has primary power and control signals which can be isolated; a test circuit operating to enable or disable each of the plurality of subarrays to identify at least one defective subarray; and at least one programmable element to isolate defective subarrays to be permanently disabled at least with respect for the end user of the memory device.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realizes and attained by means of the instrumentalities, procedures, and combinations particularly pointed out in the appended claims.

DETAILED DESCRIPTION OF THE INVENTION

Figure 1:
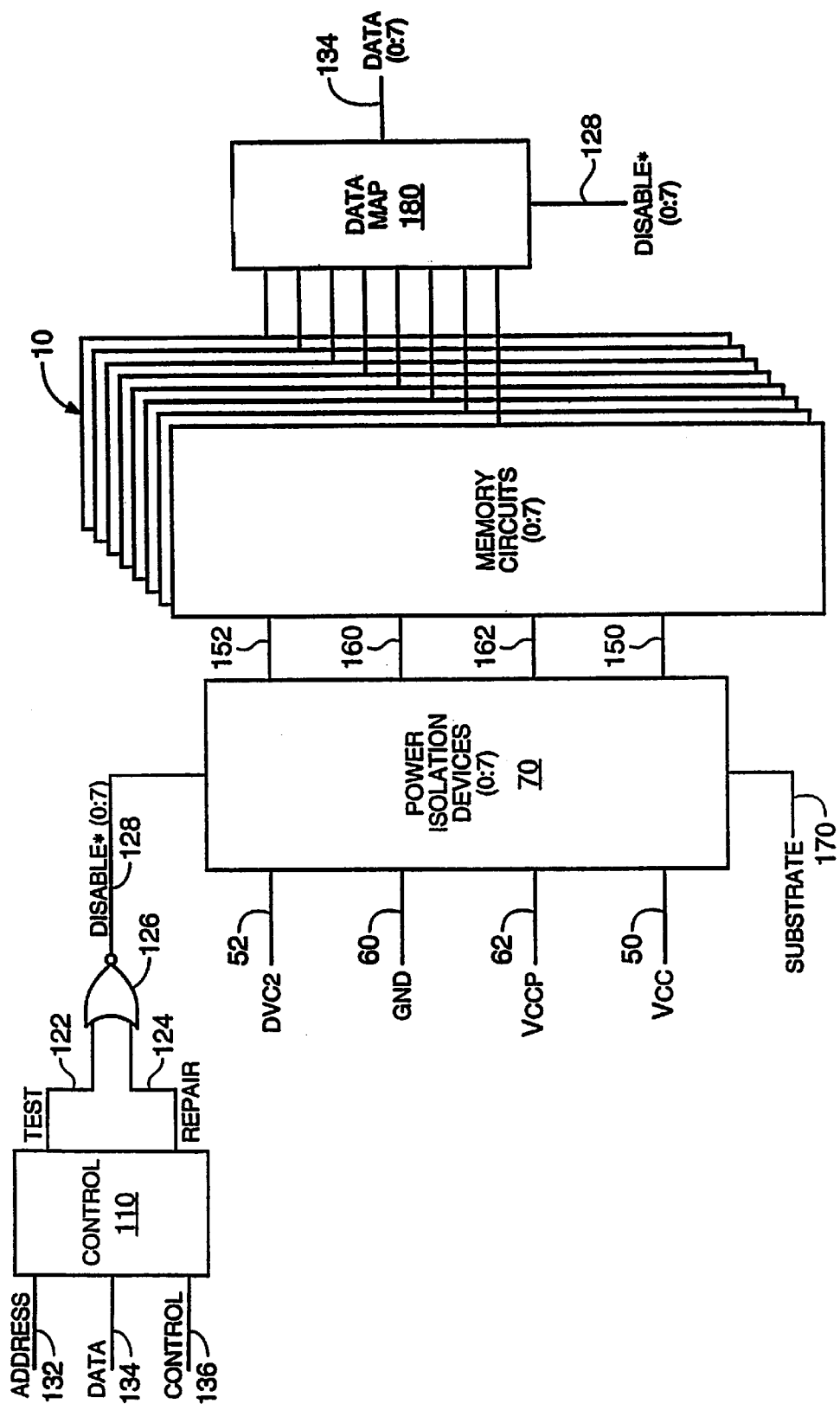
FIG. 1 is an electrical schematic diagram of a memory device in accordance with one embodiment of the invention.

In the following detailed description of the preferred embodiments, reference is made to the accompanying drawings which form a part hereof and in which is shown by way of illustration specific preferred embodiments in which the inventions may be practiced These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

One embodiment of the invention discloses an integrated circuit memory device which has multiple arrays which can be independently electrically isolated from the remaining circuitry on the integrated circuit. Each of the arrays of the integrated circuit can be independently tested to verify functionality. The increased testability of these devices provides for greater ease of isolating and solving manufacturing problems. Should an array of the integrated circuit be found to be inoperable, it is electrically isolated from the remaining circuitry so that it cannot interfere with the normal operation of the device. Defects such as power to ground shorts in an array which would have previously been catastrophic are electrically isolated allowing the remaining functional arrays to be utilized either as a repaired device or as a memory device of lessor capacity. Integrated circuit repair which includes isolation of inoperative elements eliminates the current draw and other performance degradations that have previously been associated with integrated circuits that repair defects through the incorporation of redundant elements alone. Further, the manufacturing costs associated with the production of a new device of greater integration are recuperated sooner by utilizing partially good devices which would otherwise be discarded.

Two embodiments of the present invention are described herein. One embodiment uses power isolation to isolate portions of an integrated circuit, a second embodiment uses separate generators to provide power to operable portions of the integrated circuit.

Power Isolation Switching

In accordance with one embodiment of the invention, a Dynamic Random Access Memory (DRAM) is produced. The DRAM memory array is partitioned into multiple subarrays each of which has primary power and control signals which can be electrically isolated from other circuitry on the DRAM. Additionally, the DRAM has test circuitry which is used to individually enable and disable each of the memory subarrays as needed to identify defective subarrays. The DRAM also has programmable elements which allow for the electrical isolation of defective subarrays to be permanent at least with respect to the end user of the DRAM. After the DRAM is manufactured, it is tested to verify functionality. If the device is nonfunctional, individual memory subarrays, or groups of subarrays may be electrically isolated form the remaining DRAM circuitry. Upon further test, it may be discovered that one or more memory subarrays are defective, and that these defects result in the overall nonfunctionality of the DRAM. The DRAM is then programmed to isolate the known defective subarrays and their associated circuitry. The DRAM data path is also programmed in accordance with the desired device organization. Other minor array defects may be repaired through the use of redundant memory elements. The resulting DRAM will be one of several possible memory capacities dependent upon the granularity of the subarray divisions, and the number of defective subarrays. The configuration of the DRAM may be altered in accordance with the number of defective subarrays, and the ultimate intended use of the DRAM. For example, in a 256 megabit DRAM with eight input/output data lines (32 megabits×8) and eight subarrays, an input/output may be dropped for each defective subarray. The remaining functional subarrays are internally routed to the appropriate input/output circuits on the DRAM to provide for a DRAM with an equivalent number of data words of lessor bits per word, such as a 32 megabit×5, 6 or 7 DRAM. Alternately, row or column addresses can be eliminated to provide DRAMs with a lessor number of data words of full data width such as a 4, 8 or 16 megabit×8 DRAM.

FIG. 1 is a schematic representation of a 256 megabit DRAM designed in accordance with one embodiment of the present invention. The DRAM has eight memory subarrays 10 which are selectively coupled to global signals VCC 50, DVC2 20 52, GND 60 and VCCP 62. DVC2 is a voltage source having a potential of approximately one half of VCC, and is often used to bias capacitor plates of the storage cells. VCCP is a voltage source greater than one threshold voltage above VCC, and is often used as a source for the word line drivers. Coupling is accomplished via eight isolation circuits 70, one for each subarray 10. The control circuit 110 in addition to generating standard DRAM timing, interface and control signals, generates eight test and eight repair signals 122 and 124. One each of the test and repair signals are combined in each one of eight OR gates 126 to generate a "DISABLE*" active low isolation control 128 for each of the isolation circuits 70 which correspond to the subarrays 10. It may be desirable to include circuitry that moors current draw of the device and on power up of the device isolates all subarrays in the event that excessive current is drawn by the device. Then in a test mode, the subarrays are individually enabled in order to determine which are defective. Another option is to include a test pad on the device which during test could be used to input a signal that forces all subarrays to be isolated, and allows individual subarrays to be enabled through the use of test signals.

Methods of controlling DRAMs and generating test mode signals from DRAM device ADDRESS 132, DATA 134 and CONTROL 136 signals are well known in the art. The generation of REPAIR signals 124 may be accomplished with the use of laser fuses, electrically programmable fuses or data stored in a nonvolatile memory location such as a FLASH memory register.

Methods of generating appropriate repair signals according to these methods can be accomplished by persons skilled in the art with the aid of the present description. Individual subarrays can be isolated during test or repair, and eight each of local signals 150, 152, 160 and 162 which correspond to a local source of VCC, DVC2, GND and VCCP for each subarray 10 when isolated from the global source signals 50, 52, 60 and 62, respectively, are coupled to the integrated circuit substrate potential 170. The subarrays of the DRAM can be isolated for test or repair purposes either before or after the integrated circuit is packaged depending on the method of generating the repair signals. If the repair signals are generated through the use of laser fuses, it may not be possible to isolate subarrays after the integrated circuit is packaged. If a combination of laser fuses and other techniques such as electrical fuses are used, then repair through isolation may be accomplished either before or after packaging, or both in the event that further device defects become apparent during testing of a repaired packaged device. The schematic diagram of FIG. 1 represents a DRAM where each subarray corresponds to a single input/out data line of the DATA bus 134. This architecture lends itself to repair through isolation of a subarray and elimination of an input/output data line. For each defective subarray an input/output data line is dropped, and the remaining input/output data lines are mapped to the functional subarrays. Typically, the data lines will be dropped in order of most significant to least significant for each defective subarray. For example, if the subarray that would otherwise be associated with the sixth of eight input/output data lines is isolated due to defects, the eighth data line would be dropped, the sixth data line multiplexed to the seventh subarray. Alternately, the sixth data line could simply be multiplexed to the eighth subarray. This allows for a consistent device pin out for all devices of a given data width regardless of which subarrays were isolated.

The data map circuit 180 consists of input/output data path multiplexers which are under the control of "DISABLE*" signals 128 and reroute the data input/output lines to the appropriate subarrays 10. Methods of multiplexing data lines are well known in the art and are not specifically described in this specification.

Figure 2:
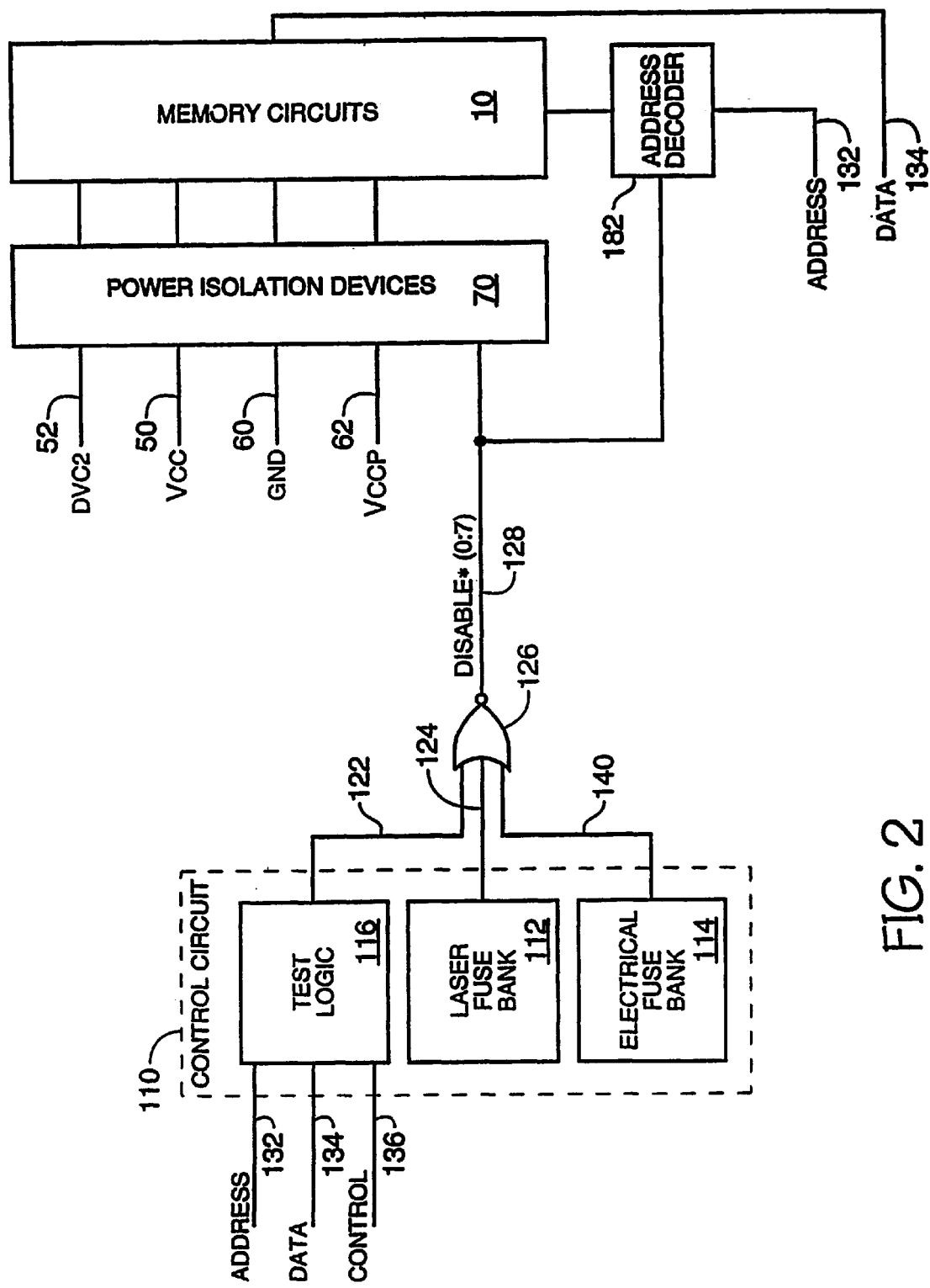
FIG. 2 is an electrical schematic diagram of a memory device in accordance with another embodiment of the invention.

FIG. 2 is a schematic representation of a DRAM which is also designed in accordance with the present invention. The DRAM has memory subarrays 10 which are selectively coupled to global signals VCC 50, DVC2 52, GND 60 and VCCP 62. Coupling is accomplished via isolation circuits 70 to each subarray 10. The control circuit 110, in addition to generating standard DRAM timing, interface and control functions, generates test signals 122, laser fuse repair signals 124 and electrical fuse repair signals 140. One each of the test and repair signals are combined in each one of logic gates 126 to generate a "DISABLE*" active low isolation control 128 for each of the isolation circuits 70 which correspond to the subarrays 10. A three input OR gate is shown to represent the logic function 126; however, numerous other methods of logically combining digital signals are known in the art. The DRAM of FIG. 2 represents a DRAM where each subarray is tied to multiple input/output data lines of the DATA bus 134. This architecture lends itself to repair through isolation of a subarray and elimination of an address line. When a defective subarray is located, half of the subarrays will be electrically isolated from the global signals 50–62, and one address line will be disabled in the address decoder 182. In this particular design the most significant row address is disabled. For example, this technique can provide a 32 megabit DRAM of the same data width as a fully functional 64 megabit DRAM. This is a simplified embodiment of the invention which is applicable to current DRAM designs with a minimum of redesign. Devices of memory capacity other than 32 megabits could be obtained through the use of additional address decode modifications and the isolation of fewer or more memory subarrays. If only a single subarray is defective out of eight possible subarrays on a 64 megabit DRAM, it is possible to design the DRAM so that it can be configured as a 56 megabit DRAM. The address range corresponding to the defective subarray can be remapped if necessary so that it becomes the highest address range. In this case, all address lines would be used, but the upper 8 megabits of address space would not be recognized as a valid address for that device, or would be remapped to a functional area of the device. Masking an 8 megabit address range can be accomplished either through programming of the address decoder or through an address decode/mask function external to the DRAM.

Figure 3:
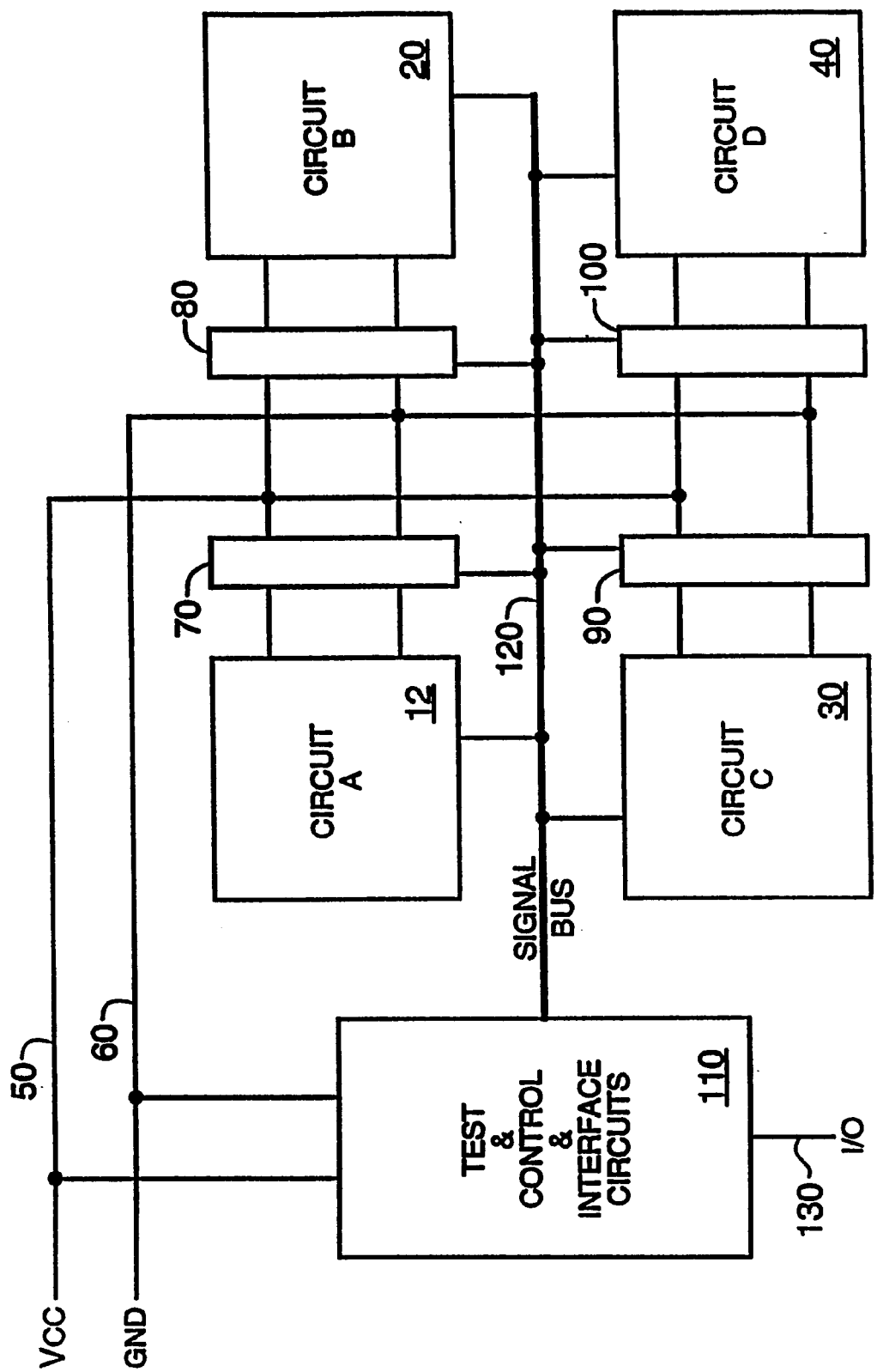
FIG. 3 is an electrical schematic diagram of an integrated circuit according to still another embodiment of the invention.

Referring now to FIG. 3, an integrated circuit is described with multiple functional elements 12, 20, 30 and 40 which may or may not be functionally identical. VCC 50, and GND 60 connections are provided to the functional elements through isolation devices 70, 80, 90 and 100. The test, control and interface circuit 110 provides control and data signals to and from the functional elements via signal bus 120. After manufacture, the device is placed in a test mode. Methods of placing a device in a test mode are well known in the art and are not specifically described herein. A test mode is provided to electrically isolate one, some or all of the functional elements 12–40 from global supply signals VCC 50 and GND 60 via control signals from 110 over signal bus 120. The capability of individually isolating each of the functional elements 12–40 allows for the ease of test of the control and interface circuits 110, as well as testing each of the functional elements 12–40 without interference from possible defective elements 12–40. Circuits that are found defective are repaired if possible through the use of redundant elements. The redundant elements may be located either within the functional blocks 12–40, or elsewhere on the device. After test and repair, any remaining defective functional elements can be programmably isolated from the global supply signals. The device can then be sold in accordance with the functions that are available. Additional signals such as other supply sources, reference signals or control signals may be isolated in addition to global supply signals VCC and GND. Control signals in particular may be isolated by simply isolating the supply signals to the control signal drivers. Further, it may be desirable to couple the local isolated nodes to a reference potential such as the substrate potential when these local nodes are isolated from the global supply, reference or control signals.

Figure 4:
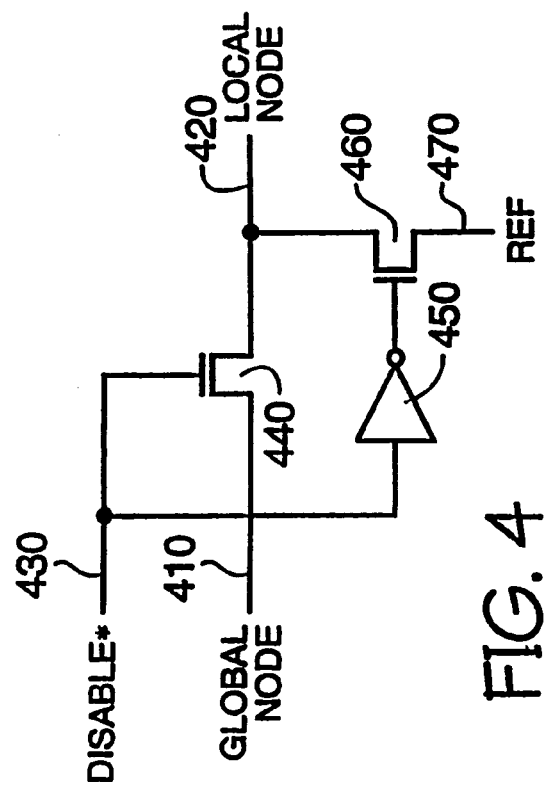
FIG. 4 is an electrical schematic diagram of the power isolation devices of FIGS. 1–3.

FIG. 4 shows one embodiment of a single isolation circuit of the type that may be used to accomplish the isolation function of elements 70–100 shown in FIGS. 1, 2 and 3. One such circuit is required for each signal to be isolated from a functional element such as elements 12–40 of FIG. 3. In FIG. 4, the global signal 410 is decoupled from the local signal 420 by the presence of a logic low level on the disable signal node 430 which causes the transistor 440 to become nonconductive between nodes 410 and 420. Additionally, when the disable node 430 is at a logic low level, invertor 450 causes transistor 460 to conduct between a reference potential 470 and the local node 420. The device size of transistor 440 will be dependent upon the amount of current it will be required to pass when it is conducting when local node is supplying current to a functioning circuit element Thus, each such device 440 may have a different device size dependent upon the characteristics of the particular global node 410, and local node 420. It should also be noted that the logic levels associated with the disable signal 430 must be sufficient to allow the desired potential of the global node to pass through the transistor 440 when the local node is not to be isolated from the global node. In the case of an n-channel transistor, the minimum high level of the disable signal will typically be one threshold voltage above the level of the global signal to be passed.

Figure 5:
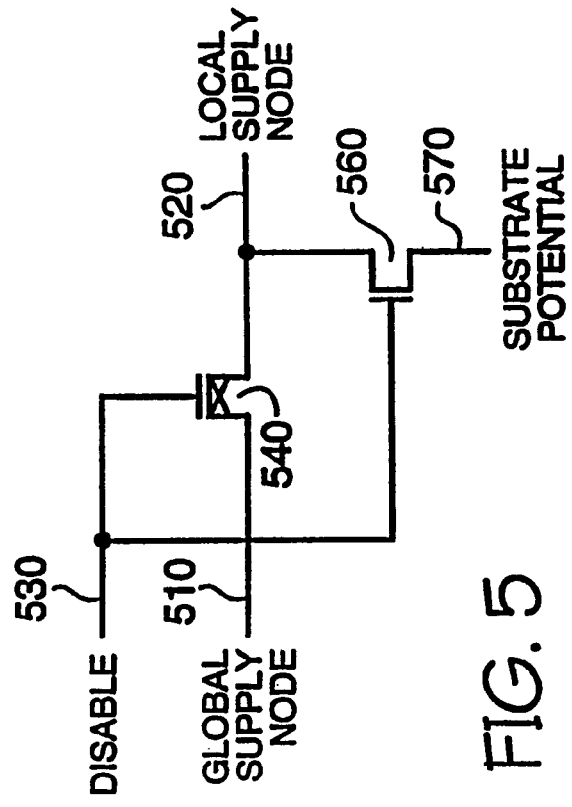
FIG. 5 is an electrical schematic diagram of an alternate embodiment of the power isolation devises of FIGS. 1–3.

FIG. 5 shows another embodiment of a single isolation circuit of the type that may be used to accomplish the isolation function of elements 70–100 shown in FIGS. 1, 2 and 3. One such circuit is required for each signal to be isolated from a functional element such as elements 12–40 of FIG. 3. In FIG. 5, the global signal 510 is decoupled from the local signal 520 by the presence of a logic high level on the disable signal node 530 which causes the transistor 540 to become nonconductive between nodes 510 and 520. Additionally, when the disable node 530 is at a logic high level, transistor 560 conducts between the device substrate potential 570 and the local node 520. By tying the isolated local nodes to the substrate potential, any current paths between the local node and the substrate, such as may have been caused by a manufacturing defect, will not draw current. In the case of a p-channel isolation transistor 540, care must be taken when the global node to be passed is a logic low. In this case the disable signal logic levels should be chosen such that the low level of the disable signal is a threshold voltage level below the level of the global signal to be passed.

Typically a combination of isolation circuits such as those shown in FIGS. 4 and 5 will be used. For example, a p-channel isolation device may be desirable for passing VCC, while an n-channel isolation device may be preferable for passing GND. In these cases, the disable signal may have ordinary logic swings of VCC to GND. If the global signal is allowed to vary between VCC and GND during operation of the part, then the use of both n-channel and p-channel isolation devices in parallel is desirable with opposite polarities of the disable signal driving the device gates.

Figure 6:
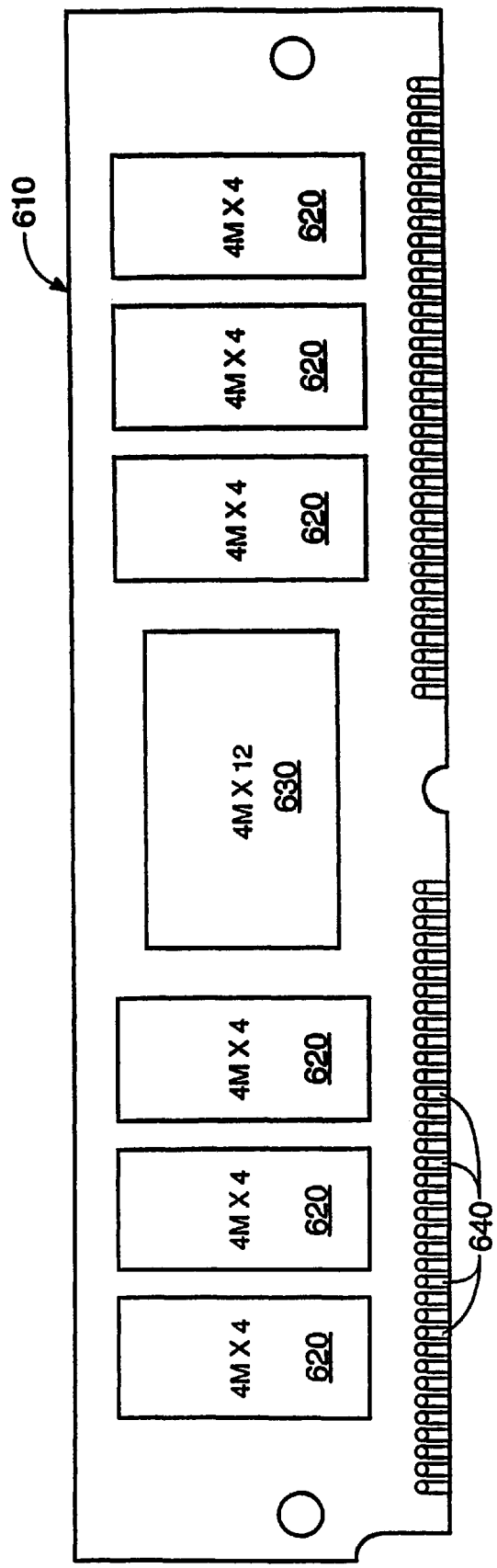
FIG. 6 is an electrical schematic diagram of a memory module in accordance with one embodiment of the invention.

FIG. 6 shows an example of a memory module designed in accordance with the teachings of the present invention. In this case the memory module is a 4 megaword by 36 bit single in line memory module (SIMM) 610. The SIMM is made up of six DRAMs 620 of the sixteen megabit DRAM generation organized as 4Meg×4's, and one DRAM 630 of the sixty-four megabit generation organized as 4Meg×12. The 4Meg×12 DRAM contains one or two defective 4Meg×2 arrays of memory elements that are electrically isolated from the remaining circuitry on the DRAM 630. In the event that the DRAM 630 has only a single defective 4Meg×2 array, but a device organization of 4Meg×12 is desired for use in a particular memory module, it may be desirable to terminate unused data input/output lines on the memory module in addition to isolating the defective array. Additionally, it may be determined that it is preferable to isolate a second 4Meg×2 array on the memory device even though it is fully functional in order to provide a lower power 4Meg×12 device. Twenty-four of the data input/output pins on connector 640 are connected to the sixteen megabit DRAMs 620. the remaining twelve data lines are connected to DRAM 630. This SIMM module has numerous advantages over a SIMM module of conventional design using nine 4M×4 DRAMs. Advantages include reduced power consumption, increased reliability and manufacturing yield due to fewer components, and increased revenue through the use and sale of what may have otherwise been a nonfunctional sixty-four megabit DRAM. The 4Meg×36 SIMM module described is merely a representation of the numerous possible organizations and types of memory modules that can be designed in accordance with the present invention by persons skilled in the art.

Figure 7:
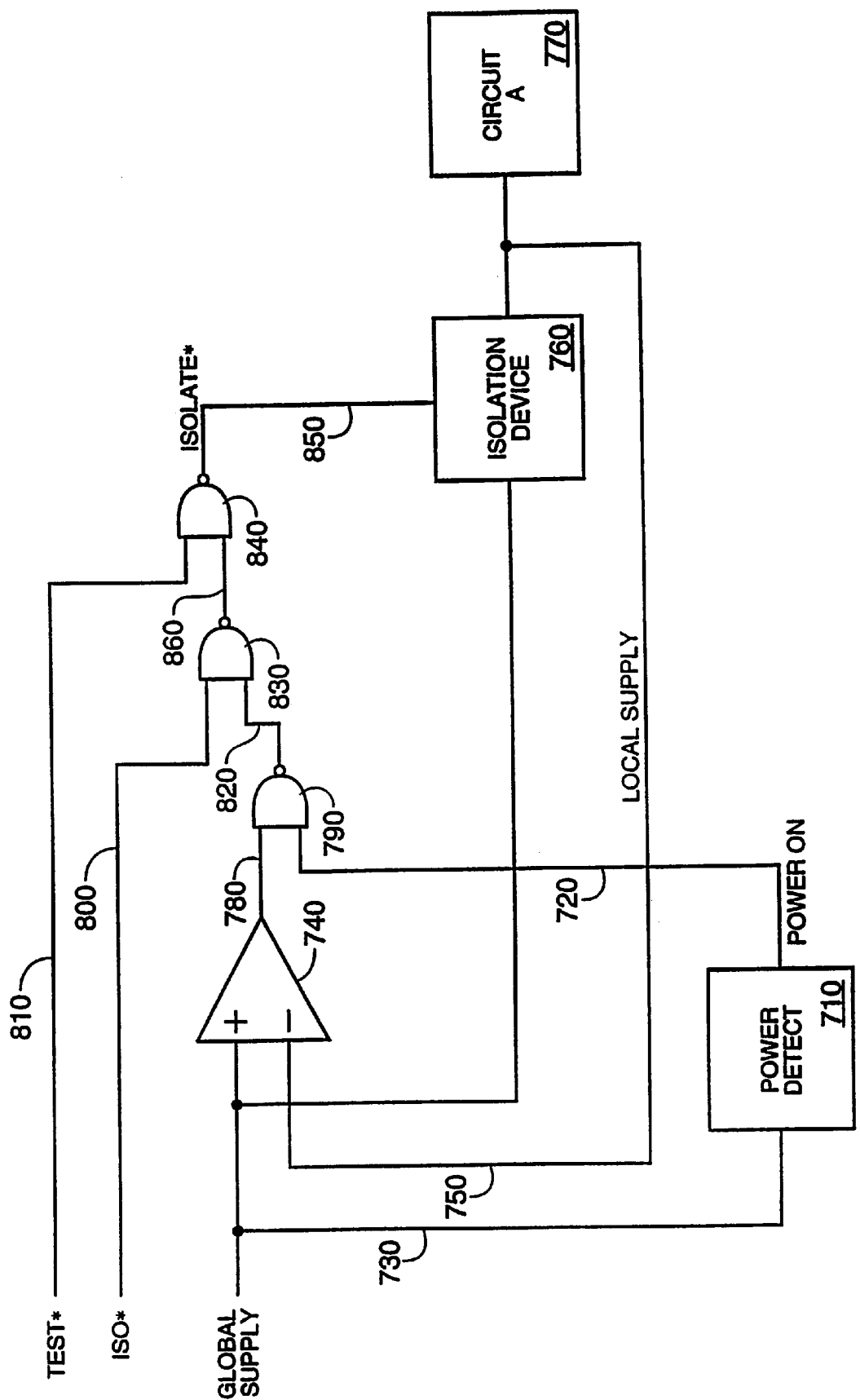
FIG. 7 is an electrical schematic diagram of an initialization circuit in accordance with an embodiment of the invention.

FIG. 7 shows an initialization circuit which when used as part of the present invention allows for automatically isolating defective circuit elements that draw excessive current when an integrated circuit is powered up. By automatically isolating circuit elements that draw excessive current the device can be repaired before it is damaged. A power detection circuit 710 is used to generate a power-on signal 720 when global supply signal 730 reaches a desired potential. Comparator 740 is used to compare the potential of global supply 730 with local supply 750. Local supply 750 will be of approximately the same potential as global supply 730 when the isolation device 760 couples 730 to 750 as long as the circuit element 770 is not drawing excessive current. If circuit element 770 does draw excessive current, the resistivity of the isolation device 760 will cause a potential drop in the local supply 750, and the comparator 740 will output a high level on signal 780. Power-on signal 720 is gated with signal 780 in logic gate 790 so that the comparison is only enabled after power has been on long enough for the local supply potential to reach a valid level. If signals 800 and 810 are both inactive high, then signal 820 from logic gate 790 will pass through gates 830 and 840 and cause isolation signal 850 to be low which will cause the isolation device 760 to decouple the global supply from the local supply. Isolation signal 800 can be used to force signal 850 low regardless of the output of the comparator as long as signal 810 is high Signal 800 may be generated from a test mode, or from a programmable source to isolate circuit element 770 for repair or test purposes. Test signal 810 may be used to force the isolation device 760 to couple the global supply to the local supply regardless of the active high disable signal 860. Signal 810 is useful in testing the device to determine the cause of excessive current draw. In an alternate embodiment, multiple isolation elements may be used for isolation device 760. On power up of the chip, a more resistive isolation device is enabled to pass a supply voltage 730 to the circuit 770. If the voltage drop across the resistive device is within a predetermined allowable range, then a second lower resistance isolation device is additionally enabled to pass the supply voltage 730 to circuit 770. This method provides a more sensitive measurement of the current draw of circuit 770. If the voltage drop across the resistive element is above an acceptable level, then the low resistance device is not enabled, and the resistive device can optionally be disabled If the resistive device does not pass enough current to a defective circuit 770, it is not necessary to disable it, or even to design it such that it can be disabled. In this case a simple resistor is adequate.

Selective Power Distribution Circuitry

Figure 8:
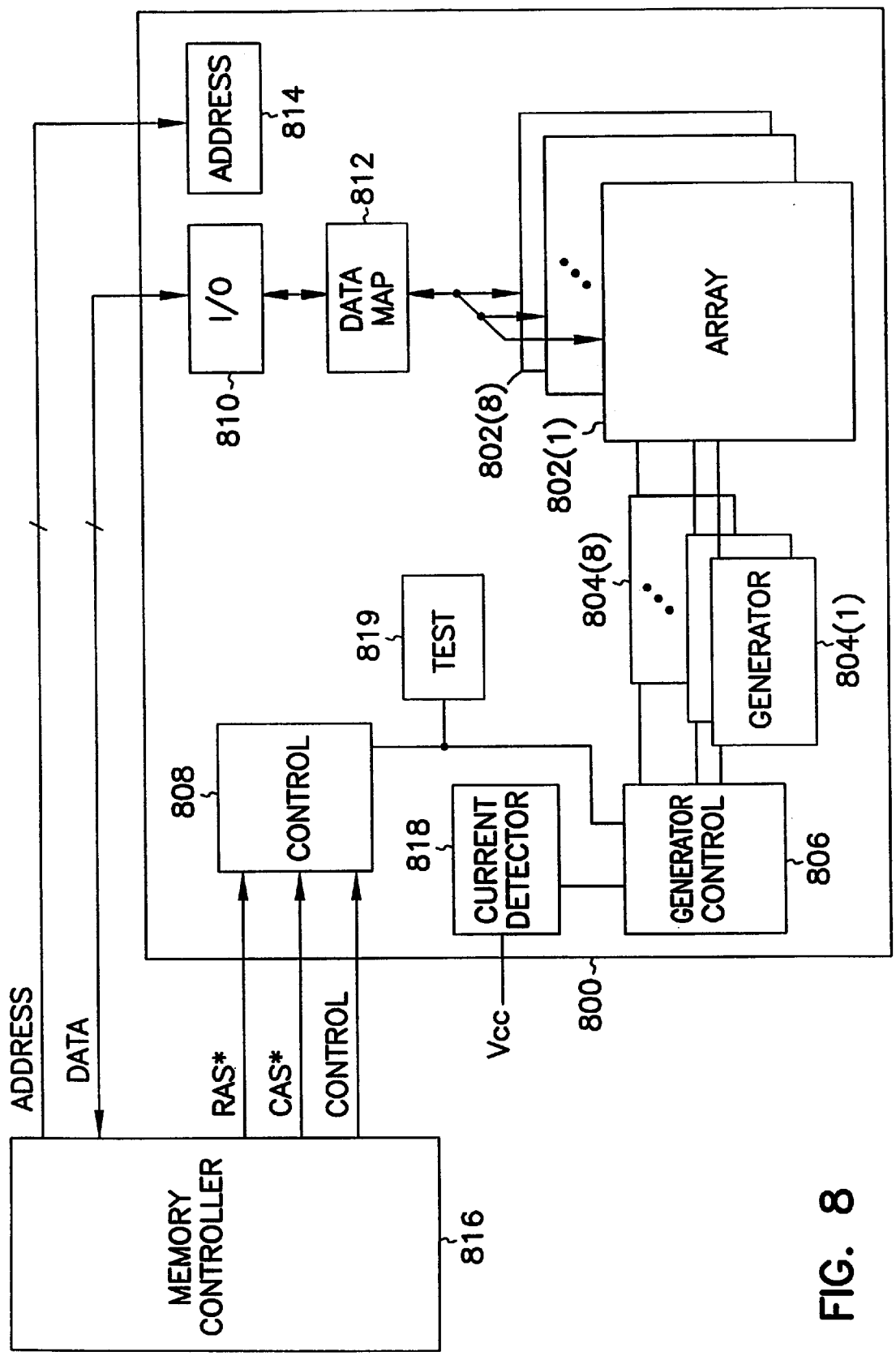
FIG. 8 is a block diagram of a memory device incorporating the present invention.

FIG. 8 is a simplified block diagram representation of a DRAM 800 designed in accordance with another embodiment of the present invention. The memory device includes memory cells arranged in eight arrays 802(1)–(8). The arrays can be described as sub-sections of the integrated circuit memory. Each array has an associated voltage generator 804(1)–(8) for providing a predetermined voltage level to the arrays. A generator control circuit 806 is included to provide control signals to the generators to selectively activate or disable the generators. Memory operation control circuit 808 is included for controlling memory data access operations, and other operations known to those skilled in the art. The control circuit receives operating signals such as RAS*, CAS*, and other known control signals. Input/output circuitry 810 (I/O) is provided to function as a data buffer for bidirectional data communication with memory controller 816. Address circuitry 814 addresses the memory arrays in response to address signals provided from the memory controller 816. A data map circuit is included to re-route, or map, the data communication lines when one of the arrays is defective, as explained above.

It may be desirable to include current detector circuitry 818 that monitors current draw of the device and on power up of the device disables the generators in the event that excessive current is drawn by the device. Then in a test mode using test circuitry 819, the generators are individually enabled in order to determine which are defective. Another option is to include a test pad on the device which during test could be used to input a signal that forces all arrays to be isolated, and allows individual arrays to be enabled through the use of test signals.

Generator control circuit 806 regulates the operation of generators 804(1)–(8). The generator control circuit can be operated in response to control circuit 808 and detector 818 to selectively turn off the generators to test the memory device for defects. Thus, the generators can be turned off (volatile) to isolate each array from its power supply. Additionally, the generator control can be programmed to disable (non-volatile) the voltage generators. The generator control can be programmed with the use of known programming and repair techniques, such as laser fuses, electrically programmable fuses or data stored in a nonvolatile memory location such as a FLASH memory register.

Methods of generating appropriate programming signals according to these methods can be accomplished by persons skilled in the art with the aid of the present description. As stated, individual generators 804 can be turned off in a volatile manner during testing. Likewise, individual generators can be disabled in a non-volatile manner during repair. The voltage supply to the arrays of the DRAM can be turned off for test or repair purposes either before or after the integrated circuit is packaged depending on the method of generating the repair signals. If the repair is accomplished through the use of laser fuses, it may not be possible to isolate arrays after the integrated circuit is packaged. If a combination of laser fuses and other techniques such as electrical fuses are used, then repair through isolation may be accomplished either before or after packaging, or both in the event that further device defects become apparent during testing of a repaired packaged device.

The diagram of FIG. 8 represents a DRAM where each array corresponds to a single input/out data line of the DATA bus which can be coupled for data communication with a memory controller, or microprocessor. This architecture lends itself to repair through isolation of an array and elimination of an input/output data line. For each defective array an input/output data line is dropped, and the remaining input/output data lines are mapped to the functional arrays. Typically, the data lines will be dropped in order of most significant to least significant for each defective array. For example, if the array that would otherwise be associated with the sixth of eight input/output data lines is isolated due to defects, the eighth data line would be dropped, the sixth data line multiplexed to the seventh array. Alternately, the sixth data line could simply be multiplexed to the eighth array. This allows for a consistent device pin out for all devices of a given data width regardless of which arrays were isolated. The data map circuit 812 consists of input/output data path multiplexers and reroute the data input/output lines to the appropriate arrays 802.

The memory device of FIG. 8 includes memory cells arranged in eight memory arrays. Each memory array has an associated voltage generator circuit 804 for providing a voltage, such as Vcc, Vccp or Vcc/2. Each one of the eight voltage generators can be selectively disabled to turn off the associated array. This method of array control provides the benefit of flexible fabrication. That is, as integrated circuits become bigger, power distribution becomes more difficult. The requirements of a single voltage generator for an entire circuit would be impractical to meet. Thus, using distributed voltage generators provides a more efficient manner of adjusting an integrated circuit than a series of isolation switches.

Example Generator

Figure 9:
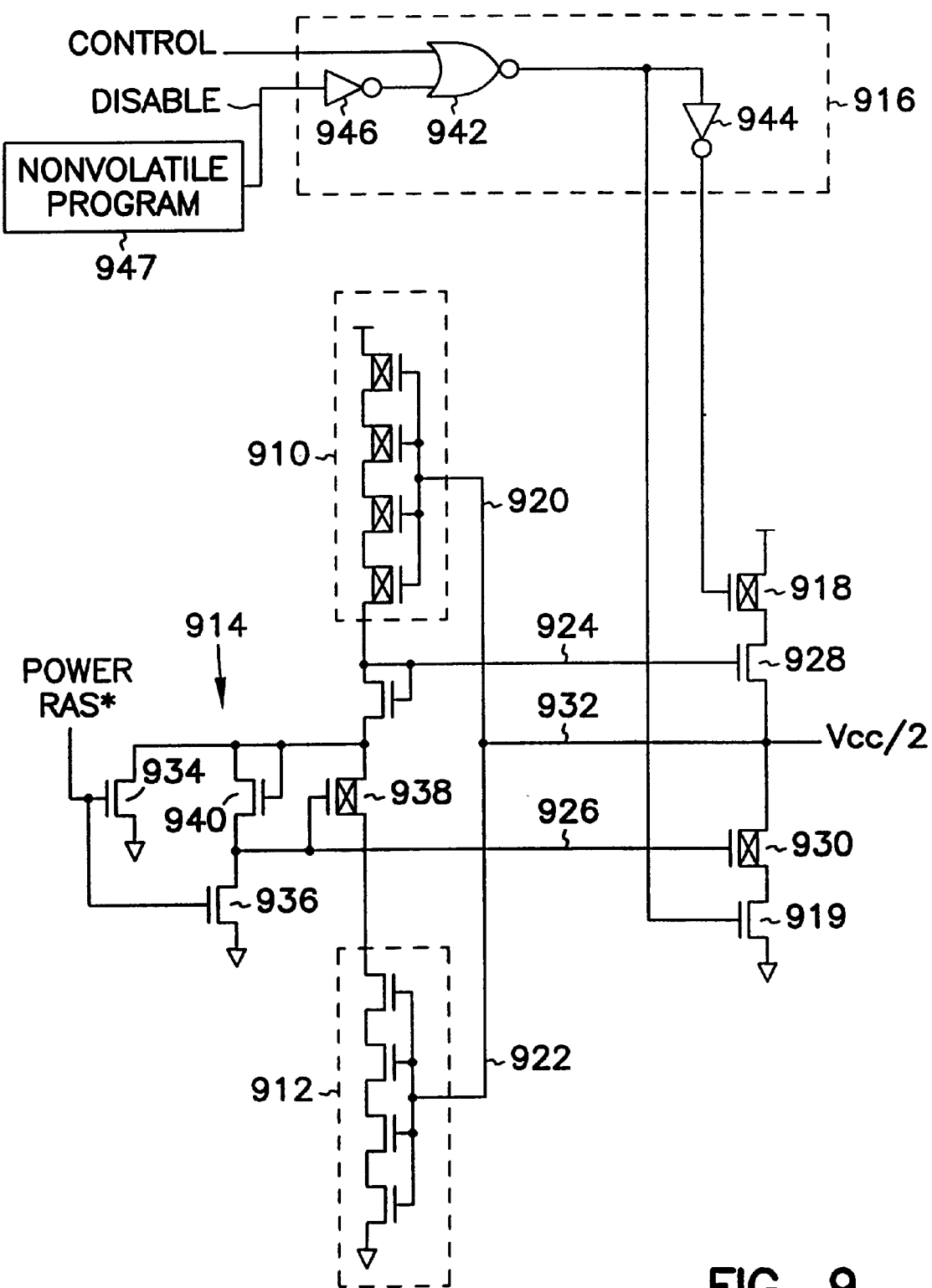
FIG. 9 is one embodiment of a voltage generator circuit of the memory of FIG. 1.

FIG. 9 illustrates one embodiment of a voltage generator circuit 806 for providing Vcc/2 to the separate arrays of the memory device. The voltage generator includes a series of bias pull-up transistors 910 and a series of bias pull-down transistors 912. These transistors are preferably fabricated as long-L transistors. Power-on circuitry 914 is provided to couple the bias transistors together when the memory RAS* signal is active.

A control circuit 916 is provided which supplies control signals to the gates of p-channel pull-up transistor 918 and n-channel pull-down transistor 919. Feed forward lines 924, 926 are provided to control n-channel pull-up transistor 928, and p-channel pull-down transistor 930. As explained below, transistors 918, 919, 928, and 930 form a voltage divider circuit and are used to interrupt the Vcc/2 voltage supply to a memory array.

Transistors 918 and 919 are normally active in response to control circuit 916. The control circuit 916 includes a NOR gate 942, first inverter 944, and second inverter 946. The NOR gate receives a Control signal and an inverted Disable signal. The output of the NOR gate is coupled to the gates of transistors 918 and 919. Under normal operation, the output of NOR gate 942 is high. Thus, the Control signal is low and the Disable signal is low. The Disable signal is used to turn off transistors 918 and 919 and turn on transistors 934 and 936 when an array is defective, and cannot be repaired. The disable circuit is preferably controlled using a non-volatile circuit 947, such as a fuse or antifuse which is programmed after fabrication and testing. Similarly, the Control signal is used to selectively interrupt the voltage generator such as during power up or testing. The Control signal, however, is a volatile signal which is not dependant upon the detection of a defective array.

The voltage generator of FIG. 9 is one embodiment of a voltage generator which can be incorporated into an integrated circuit so that the integrated circuit can be modified after fabrication to salvage the circuit if defects are discovered. Additional generator circuit designs can be incorporated, as known to those skilled in the art. For example, Vcc or Vccp generators can be provided throughout the memory device to provide a variety of voltage levels to the separate arrays.

Figure 10:
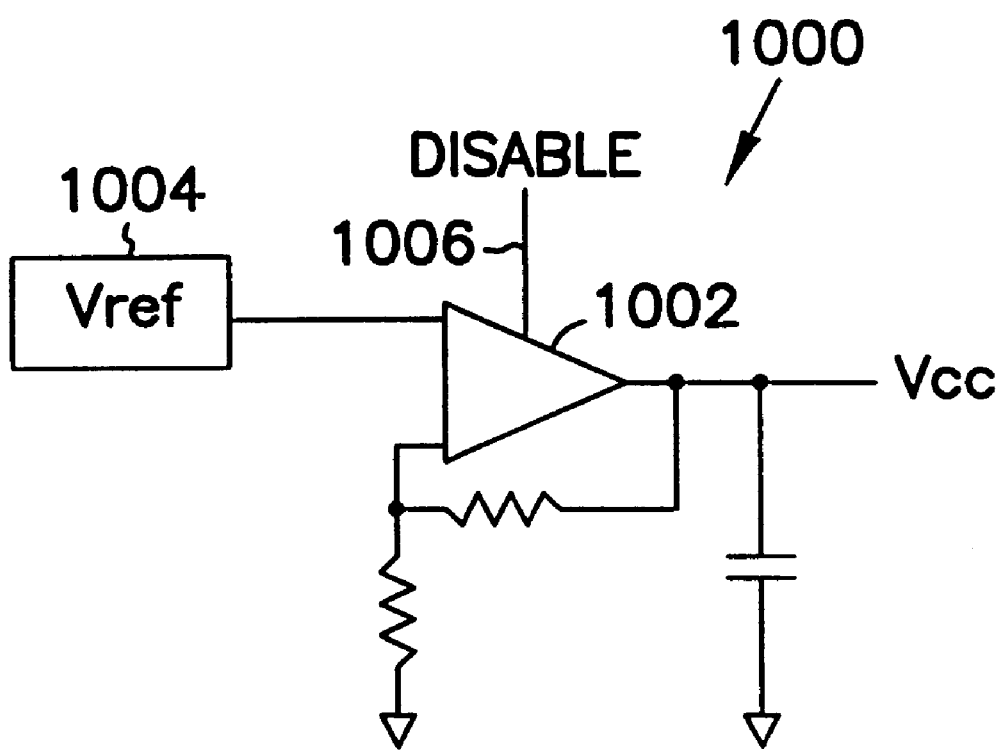
FIG. 10 is another embodiment of a voltage generator circuit of the memory of FIG. 1.

FIG. 10 illustrates an alternate embodiment of a voltage generator circuit 1000 to be used as generator 804 in the memory of FIG. 8. The generator includes an operational amplifier 1002 which receives a reference voltage Vref 1004. The amplifier includes a disable input 1006 for disabling the voltage generator circuit. Thus, a disable signal can be provided to the amplifier circuit to interrupt the supply of an output voltage (Vcc) to a memory array.

Testing

A memory circuit has been described which includes distributed voltage generators to selectively provide power to memory arrays of the memory circuit. Each memory array can be turned off if it is determined that the memory array is defective and cannot be repaired. For example, a 256 megabit DRAM with eight arrays could have a number of defective bits that would prevent repair of the device through conventional redundancy techniques. In observance of the teachings of this invention, memory devices of lower capacity are recovered for sale as 32, 64, 128 megabit or other capacities.

These lower capacity memory devices are useful in the production of memory modules specifically designed to make use of these devices. For example, a 4 megabit by 36 SIMM module which might otherwise be designed with two 4 megabit by 18 DRAMs of the 64 megabit DRAM generation, are designed with three DRAMs where one or more of the DRAMs is manufactured in accordance with the present invention such as thee each 4 megabit by 12

DRAMs. In this case each of the three DRAMs is of the 64 megabit generation, but each has only 48 megabits of functional memory cells. Memory devices of the type described in this specification can also be used in multichip modules, single-in-line packages, on motherboards, etc. It should be noted that this technique is not limited to memory devices such as DRAM, static random access memory (SRAM) and read only memory (ROM, PROM, EPROM, EEPROM, FLASH, etc.). For example, a 64 pin programmable logic array could take advantage of the disclosed invention to allow partial good die to be sold as 28, 32 or 48 pin logic devices by isolating defective circuitry on the die. As another example, microprocessors typically have certain portions of the die that utilize an array of elements such as RAM or ROM as well as a number of integrated discrete functional units. Microprocessors repaired in accordance with the teachings of this invention can be sold as microprocessors with less on board RAM or ROM, or as microprocessors with fewer integrated features. A further example is of an application specific integrated circuit (ASIC) with multiple circuits that perform independent functions such as an arithmetic unit, a timer, a memory controller, etc. It is possible to isolate defective circuits and obtain functional devices that have a subset of the possible features of a fully functional device. Isolation of defective circuits may be accomplished through the use of laser fuses, electrical fuses, other nonvolatile data storage elements, or the programming of control signals. Electrical fuses include circuits which are normally conductive and are programmably opened, and circuits which are normally open and are programmably closed such as anti-fuses.

One advantage of this invention is that it provides an integrated circuit that can be tested and repaired despite the presence of what would previously have been catastrophic defects. Another advantage of this invention is that it provides an integrated circuit that does not exhibit undesirable electrical characteristics due to the presence of defective elements. An additional advantage of the invention is an increase in the yield of integrated circuit devices since more types of device defects can be repaired. Still another advantage of the invention is that it provides an integrated circuit of decreased size by eliminating the requirement to include large arrays of redundant elements to achieve acceptable manufacturing yields of saleable devices.

The DRAM is partitioned into multiple arrays which can be electrically isolated from other circuitry on the DRAM. Additionally, the DRAM has test circuitry 819 which is used to individually activate and deactivate each of the memory arrays as needed to identify defective arrays. The DRAM also has programmable elements 806 which allow for the electrical isolation of defective arrays to be permanent at least with respect to the end user of the DRAM. After the DRAM is manufactured, it is tested to verify functionality. If the device is nonfunctional, individual memory arrays, or groups of arrays may be electrically isolated from the remaining DRAM circuitry. Upon further tests, it may be discovered that one or more memory arrays are defective, and that these defects result in the overall nonfunctionality of the DRAM. The DRAM is then programmed to isolate the known defective arrays and their associated circuitry. The DRAM data path is also programmed in accordance with the desired device organization.

Conclusion

A memory circuit has been described which includes distributed voltage generators to selectively provide power to memory arrays of the memory circuit. Each memory array can be turned off if it is determined that the memory array is defective and cannot be repaired. The memory device, therefore, can be salvaged by reducing the operational capacity of the memory device.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, the isolation circuitry described with reference to FIGS. 4 and 5 can be combined with the multiple generators to isolate an array from its associated generator without disabling the generator. Therefore, it is manifestly intended that this invention be limited only by the claims and the equivalents thereof.

What is claimed is:

1. An integrated circuit, comprising:

multiple block elements;

at least one isolation circuit, the at least one isolation circuit influencing the block elements to reduce operational capacity of at least one defective block element, wherein the at least one isolation circuit comprises:
   a current detector circuit to monitor and disable the at least one defective block element when a predetermined power usage is reached; and
   a test circuit for determining the at least one defective block element;

a bus; and a control circuit to provide control and data signals to and from the block elements via the bus.

2. A selective power distributor of a circuit, comprising:

a plurality of sub-sections of a circuit;

a plurality of voltage generators, the plurality of voltage generators in corresponding cooperative relationship with the plurality of sub-sections of a circuit;

a generator controller for selectively activating or disabling at least one of the plurality of voltage generators;

a current detector to monitor the generator, the current detector in communication with the generator controller when a predetermined limit of power usage is reached; and a tester for determining at least one defective generator.

3. A memory module, comprising:

a plurality of memory devices, at least one functionally defective;

a plurality of data input and output lines, connected correspondingly to each of the plurality of memory devices; and means for performing the function of terminating the data input and output lines and isolating the at least one functionally defective device so that the desired memory module configuration is obtained.

4. A memory module comprising:

a plurality of memory devices, at least one functionally defective;

a plurality of data input and output lines, connected correspondingly to each of the plurality of memory devices;

a terminating circuit to decouple the plurality of data input and output lines; and an isolating circuit to disassociate the at least one functionally defective device so that a desired memory module configuration is obtained.

5. A business method for recuperating integrated circuit device manufacturing costs, comprising:
   manufacturing the device;
   testing and verifying at least one subsection of the device;
   isolating at least one defective subsection of the device to prevent interference with normal operation of the device; and
   classifying the device as a repaired device or as a device of reduced capacity.

6. The business method for recuperating integrated circuit device manufacturing costs of claim 5, further comprising post-manufacturing testing and verifying of the device, and programmatically isolating the at least one defective subsection from the rest of the device.

7. The business method for recuperating integrated circuit device manufacturing costs of claim 5, further comprising post-manufacturing testing and verifying of the device, and repairing the device by applying at least one redundant element.

8. A memory array comprising:
   at least one memory subarray;
   at least one isolating circuit to selectively isolate the at least one memory subarray;
   a control circuit to provide at least one disabling signal, wherein the at least one isolating circuit is receptive to the at least one disabling signal, and wherein the at least one isolating circuit isolates the at least one memory subarray when the at least one disabling signal is at a predetermined level; and
   a data map circuit receptive to the at least one disabling signal to reroute data when the at least one memory subarray is isolated by the at least one isolating circuit.

9. A memory device comprising:
   a plurality of memory subarrays;
   a plurality of voltage generators, each voltage generator coupled to one of the plurality of memory subarrays for supplying a voltage to the one of the plurality of memory subarrays; and
   control circuitry for selectively disabling the plurality of voltage generators to non-volatilely interrupt the voltage supplied to the plurality of memory subarrays and reduce the operational capacity of the memory device.

10. A memory device comprising:
    a plurality of memory subarrays;
    a plurality of voltage generators, each voltage generator coupled to one of the plurality of memory subarrays for supplying a voltage to the one of the plurality of memory subarrays, wherein the plurality of voltage generators includes an amplifier circuit having a disable input for receiving a disable signal from the control circuitry for selectively disabling the plurality of voltage generators; and
    control circuitry for selectively disabling the plurality of voltage generators to non-volatilely interrupt the voltage supplied to the plurality of memory subarrays and reduce the operational capacity of the memory device.

11. A memory device comprising:
    a plurality of memory subarrays;
    a plurality of voltage generators, each voltage generator coupled to one of the plurality of memory subarrays for supplying a voltage to the one of the plurality of memory subarrays;
    control circuitry for selectively disabling the plurality of voltage generators to non-volatilely interrupt the voltage supplied to the plurality of memory subarrays and reduce the operational capacity of the memory device; and
    a data map circuit for coupling memory device data outputs to the plurality of memory subarrays so that a consistent memory device pin out is maintained when the at least one of the plurality of voltage generators is disabled.

12. A memory device comprising:
    a plurality of memory subarrays;
    a plurality of voltage generators, each voltage generator coupled to one of the plurality of memory subarrays for supplying a voltage to the one of the plurality of memory subarrays, wherein the plurality of voltage generators includes a voltage divider circuit having pull-up and pull-down transistors; and
    control circuitry for selectively disabling the plurality of voltage generators to non-volatilely interrupt the voltage supplied to the plurality of memory subarrays and reduce the operational capacity of the memory device, wherein a gate of the pull-up and pull-down transistors coupled to the control circuitry selectively disabling a voltage generator.

13. A memory device comprising:
    a plurality of memory subarrays;
    a plurality of voltage generators, each voltage generator coupled to one of the plurality of memory subarrays for supplying a voltage to the one of the plurality of memory subarrays; and
    control circuitry for selectively disabling the plurality of voltage generators to non-volatilely interrupt the voltage supplied to the plurality of memory subarrays and reduce the operational capacity of the memory device, wherein the control circuitry includes a non-volatile circuit for providing a disable signal to interrupt the voltage supplied to the plurality of memory arrays.

14. A memory device comprising:
    a plurality of memory subarrays;
    a plurality of voltage generators, each voltage generator coupled to one of the plurality of memory subarrays for supplying a voltage to the one of the plurality of memory subarrays; and
    control circuitry for selectively disabling the plurality of voltage generators to non-volatilely interrupt the voltage supplied to the plurality of memory subarrays and reduce the operational capacity of the memory device, wherein the control circuitry includes a volatile circuit for providing a disable signal to interrupt the voltage supplied to the plurality of memory subarrays.

15. A memory device comprising:
    a plurality of memory subarrays;
    a plurality of voltage generators, each voltage generator coupled to one of the plurality of memory subarrays for supplying a voltage to the one of the plurality of memory subarrays;
    control circuitry for selectively disabling the plurality of voltage generators to non-volatilely interrupt the voltage supplied to the plurality of memory subarrays and reduce the operational capacity of the memory device; and
    a disabling circuit to disable an address range of the memory device which corresponds to one of the memory subarrays.

16. A memory device comprising:

a plurality of memory subarrays;

a plurality of voltage generators, each voltage generator coupled to one of the plurality of memory subarrays for supplying a voltage to the one of the plurality of memory subarrays;

control circuitry for selectively disabling the plurality of voltage generators to non-volatilely interrupt the voltage supplied to the plurality of memory subarrays and reduce the operational capacity of the memory device; and a remapping circuit to remap an address range which corresponds to one of the memory arrays such that the address range corresponds to another of the memory subarrays.

17. A memory device comprising:

a plurality of memory subarrays;

a plurality of voltage generators, each voltage generator coupled to one of the plurality of memory subarrays for supplying a voltage to the one of the plurality of memory subarrays;

control circuitry for selectively disabling the plurality of voltage generators to non-volatilely interrupt the voltage supplied to the plurality of memory subarrays and reduce the operational capacity of the memory device; and a device to electrically isolate a control signal from a defective one of the memory subarrays such that defects in the defective memory subarray will not affect the control signal.

18. A partial capacity dynamic random access memory device comprising:

a first memory subarray;

a second memory subarray;

a first internal power source coupled to the first memory subarray;

a second internal power source coupled to the second memory subarray;

a first decoupling device between the first memory subarray and the first internal power source; and a second decoupling device between the second memory subarray and the second internal power source, wherein the second decoupling device is programmed to interrupt power from the second internal power source to the second memory subarray, and the second memory subarray is defective.

* * * * *

UNITED STATES PATENT AND TRADEMARK OFFICE
CERTIFICATE OF CORRECTION

PATENT NO.: 6,078,540
DATED: Jun. 20, 2000
INVENTOR(S): Keeth

It is certified that errors appear in the above-identified patent and that said Patent is hereby corrected as shown below:

In column 1, line 53 insert --Summary of the Invention --.

In column 2, line 47, delete "devises" and insert --devices --, therefor.

Signed and Sealed this

Twenty-second Day of May, 2001

*Attest:*

NICHOLAS P. GODICI

*Attesting Officer*  Acting Director of the United States Patent and Trademark Office